United States Patent
Ma (10) Patent No.: US 12,356,801 B2
(45) Date of Patent: Jul. 8, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Qian Ma, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 9 days.

(21) Appl. No.: 17/622,804

(22) PCT Filed: Dec. 17, 2021

(86) PCT No.: PCT/CN2021/139032
§ 371 (c)(1),
(2) Date: Dec. 25, 2021

(87) PCT Pub. No.: WO2023/103031
PCT Pub. Date: Jun. 15, 2023

(65) Prior Publication Data
US 2024/0032341 A1     Jan. 25, 2024

(30) Foreign Application Priority Data
Dec. 10, 2021   (CN) .................. 202111506527.8

(51) Int. Cl.
*H10K 59/12*     (2023.01)
*G09G 3/20*      (2006.01)
(Continued)

(52) U.S. Cl.
CPC .......... *H10K 59/1216* (2023.02); *G09G 3/20* (2013.01); *H10K 59/1201* (2023.02);
(Continued)

(58) Field of Classification Search
None
See application file for complete search history.

(56) References Cited

U.S. PATENT DOCUMENTS

2008/0296581 A1* 12/2008 Chao .................. H10D 86/441
                                                    438/30
2010/0302705 A1* 12/2010 Antonov ............. H01G 4/1272
                                                    361/321.5
(Continued)

FOREIGN PATENT DOCUMENTS

CN           1314608 A       9/2001
CN         104078486 A      10/2014
(Continued)

OTHER PUBLICATIONS

International Search Report in International application No. PCT/CN2021/139032, mailed on Aug. 25, 2022.
(Continued)

*Primary Examiner* — Bilkis Jahan
(74) *Attorney, Agent, or Firm* — PV IP PC; Wei Te Chung (57) ABSTRACT

The present application relates to a display panel and a manufacturing method thereof. The display panel of the present application includes a storage capacitor. The storage capacitor includes: a first capacitor electrode, a first capacitor dielectric, a second capacitor electrode, a second capacitor dielectric, an interlayer insulating layer, and a third capacitor electrode. Since the second capacitor dielectric is relatively thin, and a dielectric constant of the second capacitor dielectric is relatively high, a capacitance value of the entire storage capacitor can be increased to meet the requirements of the display panel for charge-discharge and charge retention capabilities.

8 Claims, 7 Drawing Sheets

(51) Int. Cl.
*H10K 59/121* (2023.01)
*H10K 59/126* (2023.01)

(52) U.S. Cl.
CPC ... *H10K 59/126* (2023.02); *G09G 2300/0408* (2013.01); *G09G 2300/0842* (2013.01)

(56) References Cited

U.S. PATENT DOCUMENTS

| | | | |
|---|---|---|---|
| 2014/0346452 A1* | 11/2014 | You | H10K 59/1213 257/40 |
| 2016/0141351 A1* | 5/2016 | You | H10K 59/121 438/23 |
| 2018/0033849 A1* | 2/2018 | Noh | H10D 86/471 |
| 2018/0182302 A1* | 6/2018 | Yoo | H10K 59/1216 |
| 2019/0140037 A1* | 5/2019 | Lee | H10K 59/131 |
| 2019/0288048 A1* | 9/2019 | Kang | H10K 59/1216 |
| 2020/0219770 A1* | 7/2020 | Lee | H10K 59/1216 |

FOREIGN PATENT DOCUMENTS

| | | |
|---|---|---|
| CN | 106158739 A | 11/2016 |
| CN | 107403804 A | 11/2017 |
| CN | 107680993 A | 2/2018 |
| CN | 108493198 A | 9/2018 |
| CN | 109216374 A | 1/2019 |
| CN | 110797355 A | 2/2020 |
| CN | 111816686 A | 10/2020 |
| CN | 113178492 A | 7/2021 |
| CN | 113192978 A | 7/2021 |
| WO | 2021164569 A1 | 8/2021 |

OTHER PUBLICATIONS

Written Opinion of the International Search Authority in International application No. PCT/CN2021/139032, mailed on Aug. 25, 2022.

Chinese Office Action issued in corresponding Chinese Patent Application No. 202111506527.8 dated Nov. 17, 2022, pp. 1-10.

* cited by examiner

DISPLAY PANEL AND MANUFACTURING METHOD THEREOF

BACKGROUND OF INVENTION

Field of Invention

The present application relates to a field of display technology, in particular to a display panel and a manufacturing method thereof.

Description of Prior Art

An organic light-emitting diode (OLED) display device is also known as an organic electroluminescence display device or an organic light-emitting semiconductor device. With numerous advantages such as low voltage demand, high power saving efficiency, light weight, thin thickness, simple structure, low cost, wide viewing angles, almost infinitely high contrast, low power consumption, and extremely high response times, the OLED has become one of the most important display technologies today. Current OLEDs generally use low temperature polycrystalline oxide (LTPO) substrates. The LTPO substrates include two kinds of TFT structures: indium gallium zinc oxide (IGZO) thin film transistors and low temperature polysilicon (LTPS) thin film transistors.

Currently, a gate of the LTPS TFT is generally used as a first capacitor electrode of a storage capacitor, and then a capacitor dielectric is disposed on the first capacitor electrode, and then a second gate is disposed on the capacitor dielectric as a second capacitor electrode of the storage capacitor. A thickness of the current capacitor dielectric ranges from 1000 angstroms to 3000 angstroms, and a thickness of the capacitor dielectric is relatively large. The current capacitor dielectric is generally made of SiOx or SiNx, whose dielectric constant is relatively small. A capacitance value of the storage capacitor formed thereby is relatively small and cannot meet the requirements of a display panel for charge-discharge and charge retention capabilities.

At present, when the second capacitor electrode (second gate) of the storage capacitor is defined, a light-shielding unit of the IGZO TFT is also generally defined, then an insulating layer is disposed on the second capacitor electrode, and then the IGZO TFT is defined on the insulating layer. Therefore, the current LTPO substrate requires three gate masks (for formation of the gate of the LTPS TFT, the second capacitor electrode of the storage capacitor, and the gate of the IGZO TFT), and the manufacturing process is complicated. At present, a thickness of the insulating layer on the second capacitor electrode ranges from 2000 angstroms to 10000 angstroms. The insulating layer with the greater thickness causes the LTPO substrate to have a greater thickness, which cannot meet development requirements of ultra-thin display technology.

SUMMARY OF INVENTION

An object of the present application is to provide a display panel and a manufacturing method thereof, which can solve the problems that the capacitance value of the storage capacitor in the existing display panel is small and cannot meet the requirements of a display panel for the charge-discharge and charge retention capabilities, and that the film is relatively thick and cannot meet development requirements of ultra-thin display technology.

In order to solve the above problems, the present application provides a display panel, which includes a substrate and a plurality of pixel units disposed on the substrate, and each of the pixel units includes: a driving area and a switching area, wherein each of the pixel units includes: a storage capacitor disposed in the driving area, wherein the storage capacitor includes: a first capacitor electrode disposed on the substrate in the driving area; a first capacitor dielectric disposed on a surface of a side of the first capacitor electrode away from the substrate, and extending to cover the substrate; a second capacitor electrode disposed on a surface of a side of the first capacitor dielectric away from the substrate, and arranged corresponding to the first capacitor electrode; a second capacitor dielectric is disposed on a surface of a side of the second capacitor electrode away from the substrate, and extending to cover the first capacitor dielectric; an interlayer insulating layer disposed on a surface of a side of the second capacitor dielectric away from the substrate; and a third capacitor electrode disposed on a surface of a side of the interlayer insulating layer away from the substrate, and arranged corresponding to the second capacitor electrode.

Further, each of the pixel units includes: a driving thin film transistor disposed in the driving area, wherein the driving thin film transistor includes: a first active layer disposed between the substrate and the first capacitor electrode; a first insulating layer disposed between the first active layer and the first capacitor electrode, and extending to cover the substrate; a first gate disposed in a same layer as the first capacitor electrode; and a first source-drain layer disposed on the surface of the side of the interlayer insulating layer away from the substrate, and disposed in a same layer as the third capacitor electrode.

Further, each of the pixel units includes: a switching thin film transistor disposed in the switching area, wherein the switching thin film transistor includes: a second active layer disposed between the first capacitor dielectric and the interlayer insulating layer, and disposed in a same layer as the second capacitor electrode; a second insulating layer disposed between the second active layer and the interlayer insulating layer; a second gate disposed between the second insulating layer and the interlayer insulating layer; and a second source-drain layer disposed on the surface of the side of the interlayer insulating layer away from the substrate, and disposed in the same layer as the third capacitor electrode.

Further, each of the pixel units further includes: a light-shielding unit disposed between the first insulating layer and the first capacitor dielectric, and arranged corresponding to the second active layer, and disposed in a same layer as the first capacitor electrode.

Further, the second capacitor dielectric partially covers the second active layer; and gaps are defined between opposite sides of the second insulating layer and the second capacitor dielectric.

Further, the second capacitor dielectric is made of $Al_2O_3$.

Further, a thickness of the second capacitor dielectric ranges from 50 angstroms to 100 angstroms.

In order to solve the above problems, the present application also provides a method of manufacturing a display panel, including the following steps: providing a substrate, and forming a plurality of pixel units on the substrate, wherein each of the pixel units includes: a driving area and a switching area; wherein the step of forming each of the pixel units includes: forming a storage capacitor in the driving area, which includes: forming a first capacitor electrode on the substrate in the driving area; forming a first capacitor dielectric on a surface of a side of the first capacitor electrode away from the substrate, wherein the first capacitor dielectric extends to cover the substrate; forming a second capacitor electrode on a surface of a side of the first capacitor dielectric away from the substrate, wherein the second capacitor electrode is arranged corresponding to the first capacitor electrode; forming a second capacitor dielectric on a surface of a side of the second capacitor electrode away from the substrate, wherein the second capacitor dielectric extends to cover the first capacitor dielectric; forming an interlayer insulating layer on a surface of a side of the second capacitor dielectric away from the substrate; and forming a third capacitor electrode on a surface of a side of the interlayer insulating layer away from the substrate, wherein the third capacitor electrode is arranged corresponding to the second capacitor electrode.

Further, before the step of forming the first capacitor dielectric on the surface of the side of the first capacitor electrode away from the substrate, the manufacturing method further includes the following steps: forming a light-shielding unit on the substrate in the switching area, wherein the light-shielding unit and the first capacitor electrode are formed at a same time.

Further, before the step of forming the second capacitor dielectric on the surface of the side of the second capacitor electrode away from the substrate, the manufacturing method further includes the following steps: forming a second active layer on the surface of the side of the first capacitor dielectric away from the substrate; wherein the second active layer and the second capacitor electrode are formed at a same time; forming a second insulating layer on a surface of a side of the second active layer away from the substrate; and forming a second gate on a surface of a side of the second insulating layer away from the substrate.

Compared with the prior art, in the present application, a light-shielding unit is formed while preparing a first gate of a driving thin film transistor; the second capacitor electrode of the storage capacitor is formed while forming a second active layer of the switching thin film transistor; the third capacitor electrode of the storage capacitor is formed while forming the first source-drain layer of the thin film transistor, thereby saving one gate mask, improving production efficiency and saving production costs. In the present application, the first capacitor electrode, the first capacitor dielectric, the second capacitor electrode, the second capacitor dielectric, and the third capacitor electrode are adopted to form a sandwich capacitor. Because the second capacitor dielectric is relatively thin, and a dielectric constant of the second capacitor dielectric is relatively high, so that a capacitance value of the entire storage capacitor can be increased, thereby meeting the requirements of a display panel for charge-discharge and charge retention capabilities. Meanwhile, the second capacitor dielectric is relatively thin, which can reduce the thickness of the display panel, thereby meeting the development requirements of ultra-thin display technology.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these FIGS. without paying creative work.

Elements in the drawings are designated by reference numerals listed below.
- 100. display panel; 101. substrate;
- 102. pixel unit;
- 1011. first base; 1012. first buffer layer;
- 1013. second base;
- 1021, driving area; 1022, switching area;
- 1. second buffer layer; 2. electrostatic shielding layer;
- 3. third buffer layer; 4. barrier layer;
- 5. first active layer; 6. Vss wiring;
- 7. first insulating layer; 8. first capacitor electrode;
- 9. light-shielding unit; 10. first capacitor dielectric;
- 11. second capacitor electrode; 12. second active layer;
- 13. second insulating layer; 14. second gate;
- 15. second capacitor dielectric; 16. interlayer insulating layer;
- 17. third capacitor electrode; 18. first source-drain layer;
- 19. second source-drain layer; 20. passivation layer;
- 21. photoresist pattern; 22. aluminum layer;
- 23. semi-finished product of first active layer; 24. semi-finished product of Vss wiring;
- 25. first metal film; 26. semi-finished product of second capacitor electrode;
- 27. semi-finished product of second active layer; 28. semi-finished product of second insulating layer;

29. second metal film; 30. connection hole;
51. first channel portion; 52. first connection portion;
121. second channel portion; 122. second connection portion.

DETAILED DESCRIPTION OF PREFERRED EMBODIMENTS

The preferred embodiments of the present invention are described in detail below with reference to the accompanying drawings, in which FIG. Those skilled in the art will more readily understand how to implement the invention. The present invention may, however, be embodied in many different forms and embodiments, and the scope of the invention is not limited to the embodiments described herein.

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the FIGS. which are merely references.

In the drawings, the spatially relative terms are intended to encompass different orientations in addition to the orientation as depicted in the figures. Moreover, the size and thickness of each component shown in the drawings are arbitrarily shown for ease of understanding and description, and the invention does not limit the size and thickness of each component.

Figure 1:
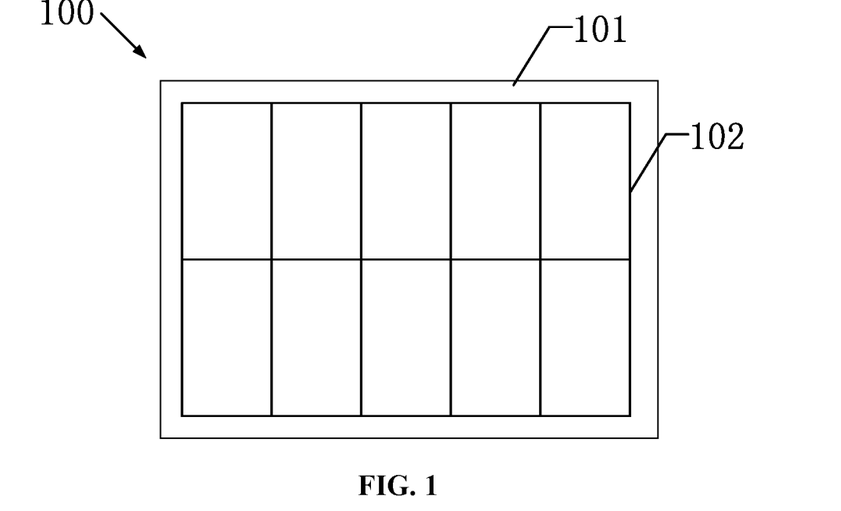
FIG. 1 is a schematic plan view of a display panel of the present application.

As shown in FIG. 1, this embodiment provides a display panel 100. The display panel 100 includes a substrate 101 and a plurality of pixel units 102 disposed on the substrate 101. In this embodiment, the pixel units 102 are arranged in an array.

Figure 2:
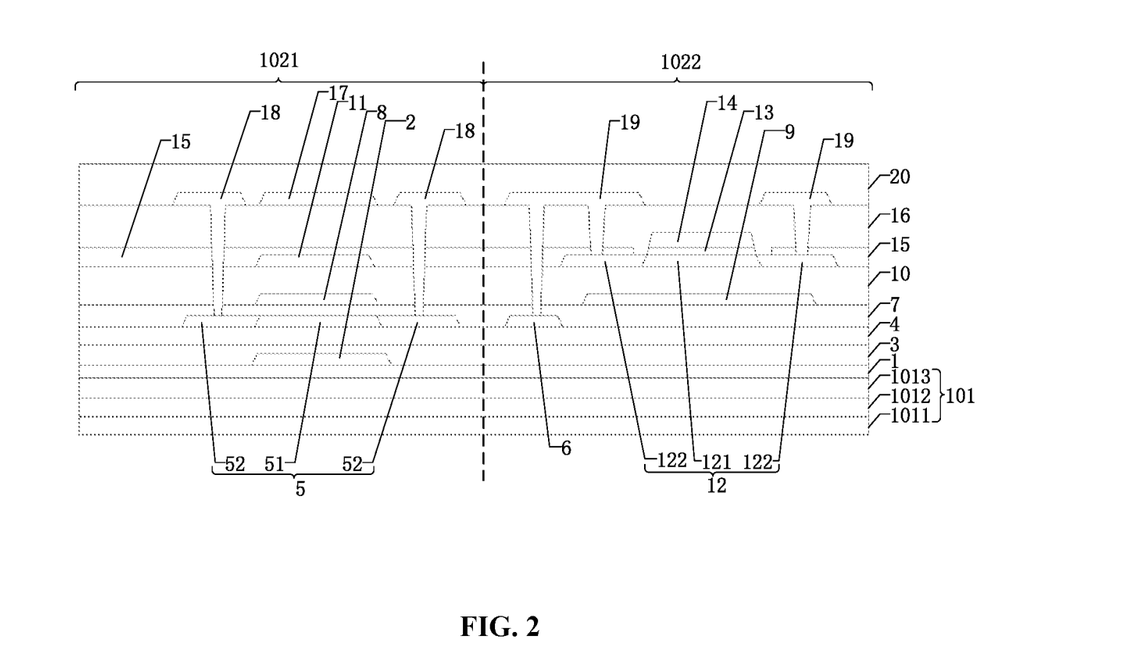
FIG. 2 is a schematic structural diagram of the display panel of the present application.

As shown in FIG. 2, each pixel unit 102 includes: a driving area 1021 and a switching area 1022.

As shown in FIG. 2, the substrate 101 is located in the driving area 1021 and the switching area 1022. The substrate 101 includes a first base 1011, a first buffer layer 1012, and a second base 1013.

A material of the first base 1011 includes polyimide, polycarbonate, polyethylene terephthalate, polyethylene naphthalate, and the like.

The first buffer layer 1012 is disposed on the first base 1011. A material of the first buffer layer 1012 may be SiOx or SiNx. The first buffer layer 1012 may also be a multilayered structure film formed of SiOx and SiNx. As a result, an impact resistance of the substrate 101 is improved, thereby effectively protecting the display panel 100.

The second base 1013 is disposed on a surface of a side of a first buffer layer 1012 away from the first base 1011. A material of the second base 1013 includes polyimide, polycarbonate, polyethylene terephthalate, polyethylene naphthalate, and the like.

As shown in FIG. 2, each pixel unit 102 includes: a second buffer layer 1, an electrostatic shielding layer 2, a third buffer layer 3, a barrier layer 4, a first active layer 5, a Vss wiring 6, a first insulating layer 7, a first capacitor electrode 8, light-shielding unit 9, a first capacitor dielectric 10, a second capacitor electrode 11, a second active layer 12, a second insulating layer 13, a second gate 14, a second capacitor dielectric 15, an interlayer insulating layer 16, a third capacitor electrode 17, a first source-drain layer 18, a second source-drain layer 19, and a passivation layer 20.

As shown in FIG. 2, the second buffer layer 1 is disposed on a surface of a side of the second base 1013 away from the first base 1011, and is located in the driving area 1021 and the switching area 1022. A material of the second buffer layer 1 may be SiOx or SiNx. The second buffer layer 1 may also be a multilayered structure film formed of SiOx and SiNx.

As shown in FIG. 2, the electrostatic shielding layer 2 is disposed on a surface of a side of the second buffer layer 1 away from the substrate 101 and located in the driving area 1021. The electrostatic shielding layer 2 may be made of a-Si, thereby preventing static electricity from damaging the driving thin film transistor.

As shown in FIG. 2, the third buffer layer 3 is disposed on a surface of a side of the electrostatic shielding layer 2 away from the substrate 101 and extends to cover the second buffer layer 1 in the driving area 1021 and the switching area 1022. A material of the third buffer layer 3 can be SiOx or SiNx. The third buffer layer 3 may also be a multilayered structure film formed of SiOx and SiNx.

As shown in FIG. 2, the barrier layer 4 is disposed on a surface of a side of the third buffer layer 3 away from the substrate 101, and is located in the driving area 1021 and the switching area 1022. The barrier layer 4 is mainly configured to prevent water vapor from damaging the driving thin film transistor by preventing intrusion of water vapor. A material of the barrier layer 4 may be SiOx or SiNx. The barrier layer 4 may also be a multilayered structure film formed of SiOx and SiNx.

As shown in FIG. 2, the first active layer 5 is disposed on a surface of a side of the barrier layer 4 away from the substrate 101 and located in the driving area 1021. The first active layer 5 includes a first channel portion 51 and two first connection portions 52 located at opposite ends of the first channel portion 51.

The first channel portion 51 of the first active layer 5 is arranged corresponding to the electrostatic shielding layer 2.

The Vss wiring 6 is arranged in the same layer as the first active layer 5, and is located in the driving area 1021. In this embodiment, the Vss wiring 6 and the first active layer 5 are made of a same material, and can be prepared and formed at the same time, which saves the production processes and improves production efficiency. The Vss wiring 6 is mainly configured to discharge static electricity of the switching thin film transistor.

The first insulating layer 7 is disposed on surfaces of sides of the first active layer 5 and the Vss wiring 6 away from the substrate 101 and extends to cover the barrier layer 4. A material of the first insulating layer 7 may be SiOx or SiNx. The first insulating layer 7 may also be a multilayered structure film formed of SiOx and SiNx. A thickness of the first insulating layer 7 ranges from 1000 angstroms to 3000 angstroms.

The first capacitor electrode 8 is arranged on a surface of a side of the first insulating layer 7 away from the substrate 101 and is arranged corresponding to a first channel portion 51 of the first active layer 5. A material of the first capacitor electrode 8 can be Mo, Al, Cu, Ti, etc., or an alloy. A thickness of the first capacitor electrode 8 ranges from 2000 angstroms to 8000 angstroms.

The light-shielding unit 9 is arranged on the same layer as the first capacitor electrode 8 and is located in the switching area 1022. In this embodiment, the light-shielding unit 9 and the first capacitor electrode 8 are made of a same material, and thus can be prepared and formed at the same time, which saves the production processes and improves the production efficiency.

The first capacitor dielectric 10 is disposed on surfaces of sides of the first capacitor electrode 8 and the light-shielding unit 9 away from the substrate 101 and extends to cover the first insulating layer 7. A material of the first capacitor dielectric may be SiOx or SiNx. The first capacitor dielectric 10 may also be a multilayered structure film formed of SiOx and SiNx. A thickness of the first capacitor dielectric 10 ranges from 1000 angstroms to 3000 angstroms.

The second capacitor electrode 11 is disposed on a surface of a side of the first capacitor dielectric 10 away from the substrate 101 and is disposed corresponding to the first capacitor electrode 8. The second capacitor electrode 11 is a metal oxide semiconductor, and its material can be IGZO, IZTO, IGZTO, or the like. A thickness of the second capacitor electrode 11 ranges from 100 angstroms to 1000 angstroms.

The second active layer 12 and the second capacitor electrode 11 are disposed in the same layer, and are arranged corresponding to the light-shielding unit 9. In this embodiment, the second active layer 12 and the second capacitor electrode 11 are made of a same material, and thus can be prepared and formed at the same time, which saves the production processes and improves the production efficiency. The second active layer 12 includes a second channel portion 121 and two second connection portions 122.

The second insulating layer 13 is disposed on a surface of a side of the second active layer 12 away from the substrate 101 and is disposed corresponding to the second channel portion 121 of the second active layer 12. A material of the second insulating layer 13 may be SiOx or SiNx. The second insulating layer 13 may also be a multilayered structure film formed of SiOx and SiNx. A thickness of the second insulating layer 13 ranges from 1000 angstroms to 3000 angstroms.

The second gate 14 is disposed on a surface of a side of the second insulating layer 13 away from the substrate 101 and is disposed corresponding to the second channel portion 121 of the second active layer 12. A material of the second grid 14 can be Mo, Al, Cu, Ti, etc., or an alloy. A thickness of the second gate 14 ranges from 2000 angstroms to 8000 angstroms.

The second capacitor dielectric 15 is disposed on a surface of a side of the second capacitor electrode 11 away from the substrate 101 and extends to cover the first capacitor dielectric 10. The second capacitor dielectric 15 partially covers the two second connection portions 122 of the second active layer 12; a gap is defined between each of opposite sides of the second insulating layer 13 and the second capacitor dielectric 15.

A material of the second capacitor dielectric 15 is $Al_2O_3$. Since a dielectric constant of $Al_2O_3$ is relatively high, a capacitance value of the storage capacitor can be increased, thereby meeting the requirements of the display panel 100 for charge-discharge and charge retention capabilities.

A thickness of the second capacitor dielectric 15 ranges from 50 angstroms to 100 angstroms. In this embodiment, the thickness of the second capacitor dielectric is 75 angstroms. In other embodiments, the thickness of the second capacitor dielectric 15 may be 60 angstroms, 80 angstroms, or 90 angstroms. The thickness of the second capacitor dielectric 15 formed of $Al_2O_3$ in this embodiment is thinner than the thickness of the insulating layer (1000 angstroms to 3000 angstroms) formed of SiOx and SiNx in the prior art, so that the storage capacitor can be improved. The capacitance value further satisfies the requirements of the display panel 100 for the charge-discharge and charge retention capabilities. Meanwhile, the overall thickness of the display panel 100 is reduced, thereby meeting the development requirements of ultra-thin display technology.

The interlayer insulating layer 16 is disposed on a surface of a side of the second capacitor dielectric 15 away from the substrate 101. A material of the interlayer insulating layer 16 may be SiOx or SiNx, or an organic material. A thickness of the interlayer insulating layer 16 ranges from 2000 angstroms to 10000 angstroms.

The third capacitor electrode 17 is disposed on a surface of a side of the interlayer insulating layer 16 away from the substrate 101 and is disposed corresponding to the second capacitor electrode 11. A material of the third capacitor electrode 17 may be Mo, Al, Cu, Ti, etc., or an alloy. A thickness of the third capacitor electrode 17 ranges from 2000 angstroms to 8000 angstroms.

The first source-drain layer 18 and the third capacitor electrode 17 are disposed in the same layer, and are electrically connected to the two first connection portions 52 of the first active layer 5. In this embodiment, the first source-drain layer 18 and the third capacitor electrode 17 are made of the same material, and thus can be fabricated and formed at the same time, which saves the production processes and improves production efficiency.

The second source-drain layer 19 and the third capacitor electrode 17 are disposed in the same layer, are electrically connected to the two second connection portions 122 of the second active layer 12, and are electrically connected to the Vss wiring 6. In this embodiment, the second source-drain layer 19 and the third capacitor electrode 17 are made of the same material, and thus can be fabricated and formed at the same time as the third capacitor electrode 17, which saves the production processes and improves the production efficiency.

The passivation layer 20 is disposed on surfaces of sides of the first source-drain layer 18, the second source-drain layer 19, and the third capacitor electrode 17 away from the substrate 101, and extends to cover the interlayer insulating layer 16.

In summary, the first active layer 5, the first insulating layer 7, the first capacitor electrode (first gate) 8, the first capacitor dielectric 10, the second capacitor dielectric 15, the interlayer insulating layer 16, and the first source-drain layer 18 collectively constitute the driving thin film transistor.

In summary, the second active layer 12, the second insulating layer 13, the second gate 14, the interlayer insulating layer 16, and the second source-drain layer 19 collectively constitute the switching thin film transistor.

In summary, the first capacitor electrode 8, the first capacitor dielectric 10, the second capacitor electrode 11, the second capacitor dielectric 15, the interlayer insulating layer 16, and the third capacitor electrode 17 collectively form a three-layered sandwich storage capacitor. Compared with a dual plate capacitor in the prior art, the capacitance value of the storage capacitor in this embodiment is larger. Moreover, the second capacitor dielectric in this embodiment has a higher dielectric constant and a thinner thickness, which can also increase the capacitance value of the storage capacitor, thereby meeting the requirements of the display panel for charge-discharge and charge retention capabilities, and meanwhile, it can meet the development requirements of ultra-thin display technology.

As shown in FIGS. 3 to 15, this embodiment also provides a method of manufacturing the display panel of this embodiment, which includes: providing a substrate 101 on which a plurality of pixel units 102 are prepared, each of the pixel units 102 each includes a driving area 1021 and a switching area 1022.

Figure 3:
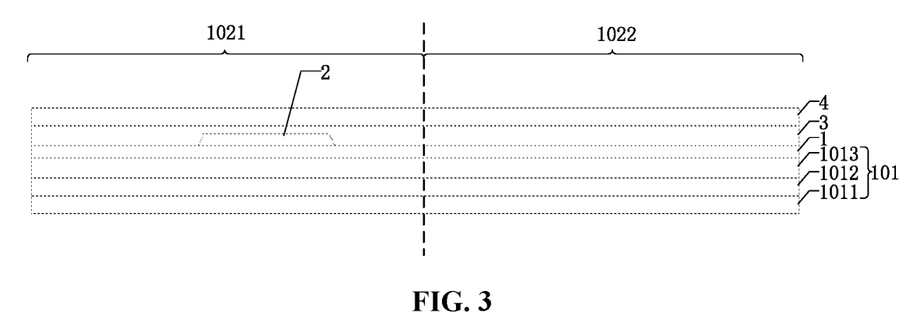
FIG. 3 is a schematic diagram of forming a second buffer layer, an electrostatic shielding layer, a third buffer layer, and a barrier layer on a substrate.

As shown in FIG. 3, the step of forming each of the pixel units 102 includes: S1, forming a second buffer layer 1 on the substrate 101 in the driving area 1021 and the switching area 1022; S2, forming an electrostatic shielding layer 2 on the second buffer layer 1 in the driving area 1021; S3 forming a third buffer layer 3 on the electrostatic shielding layer 2 and the second buffer layer 1; and S4, forming a barrier layer 4 on the third buffer layer 3.

Figure 4:
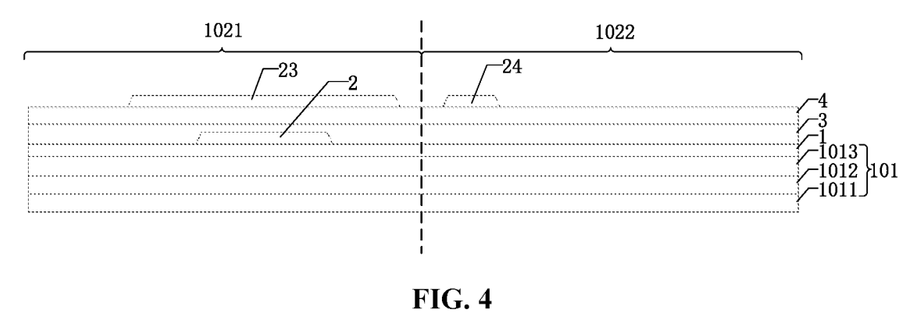
FIG. 4 is a schematic diagram of forming a semi-finished product of a first active layer and a semi-finished product of Vss wiring on a barrier layer.

As shown in FIG. 4, the step of forming each of the pixel units 102 further includes: S5, preparing a semi-finished product 23 of a first active layer and a semi-finished product 24 of a Vss wiring on the barrier layer 4. The step S5 specifically includes: depositing a layer of low-temperature polysilicon (LTPS) on the barrier layer 4 followed by patterning to form a semi-finished product 23 of the first active layer and the semi-finished product 24 of a Vss wiring. The first active layer semi-finished product 23 and the semi-finished product 24 of a Vss wiring are prepared and formed at the same time, thereby saving the production processes and improving the production efficiency.

Figure 5:
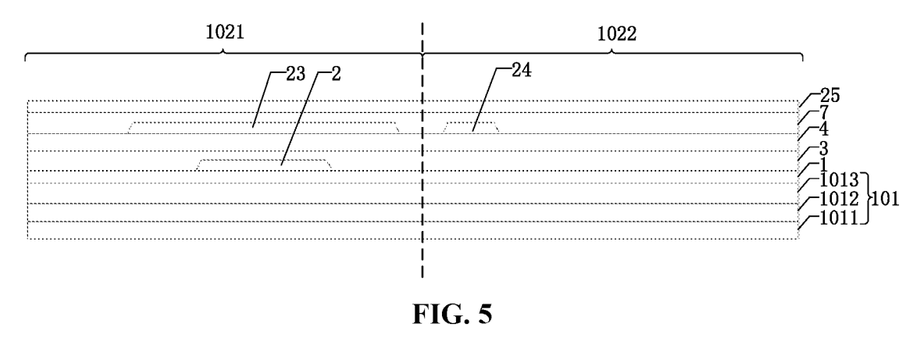
FIG. 5 is a schematic diagram of preparing a first metal film on a first insulating layer.
Figure 6:
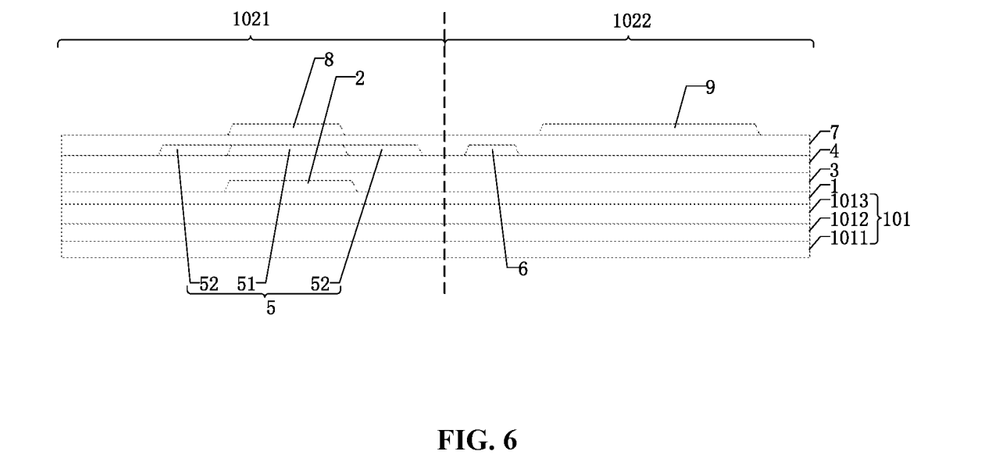
FIG. 6 is a schematic diagram of patterning a first metal film to form a first capacitor electrode and the light-shielding unit.

As shown in FIG. 5 and FIG. 6, the step of forming each of the pixel units 102 further includes: S6, forming a first insulating layer 7 on the semi-finished product 23 of the first active layer, the semi-finished product 24 of a Vss wiring, and the barrier layer 4; and S7, forming a first capacitor electrode 8 and the light-shielding unit 9 on the first insulating layer 7.

As shown in FIGS. 5 and 6, the step S7 specifically includes: preparing a first metal film 25 on an entire surface of the first insulating layer 7, and then patterning the first metal film 25 to form the first capacitor electrode 8 and the light-shielding unit 9. The semi-finished product 23 of the first active layer corresponding to the first capacitor electrode 8 is divided into a first channel portion 51, and the semi-finished product 23 of the first active layer that does not correspond to the first capacitor electrode 8 is divided into the semi-finished product of the first connection portion. The semi-finished product of the first connection portion is doped to form the first connection portion 52, and the semi-finished product 24 of a Vss wiring is doped to form the Vss wiring 6.

Figure 7:
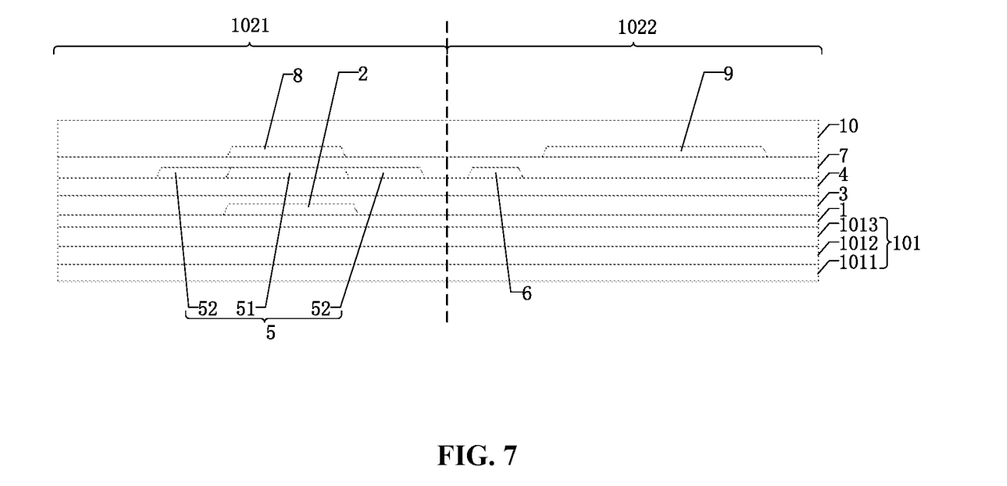
FIG. 7 is a schematic diagram of forming a first capacitor dielectric on a first capacitor electrode, a light-shielding unit, and a first insulating layer.

As shown in FIG. 7, the step of forming each of the pixel units 102 further includes: S8, preparing a first capacitor dielectric 10 on the first capacitor electrode 8, the light-shielding unit 9, and the first insulating layer 7.

Figure 8:
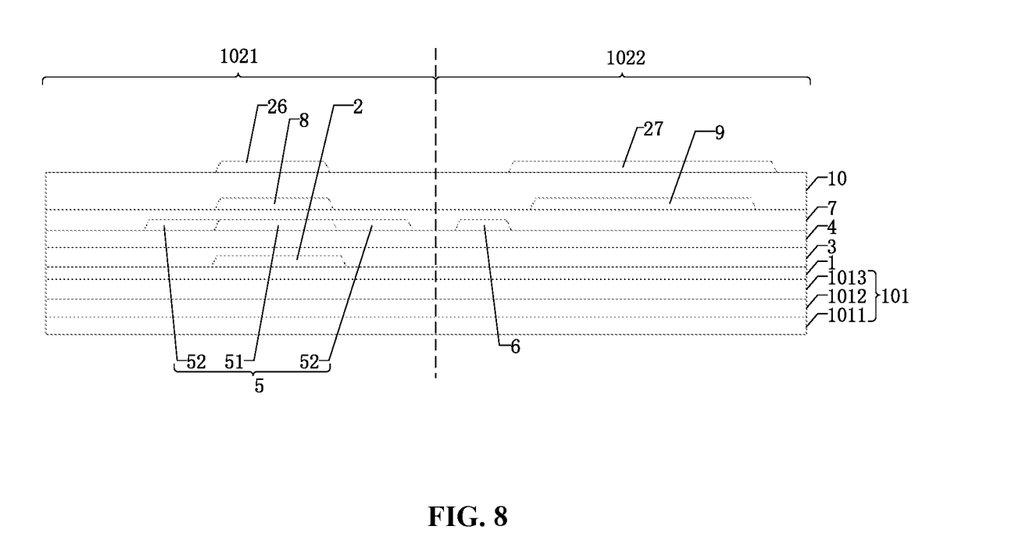
FIG. 8 is a schematic diagram of forming a semi-finished product of a second capacitor electrode and a semi-finished product of a second active layer on the first capacitor dielectric.

As shown in FIG. 8, the step of forming each of the pixel units 102 further includes: S9, forming a semi-finished product 26 of a second capacitor electrode and a semi-finished product 27 of a second active layer on the first capacitor dielectric 10. The semi-finished product 26 of the second capacitor electrode and the semi-finished product 27 of the second active layer are prepared and formed at the same time, thereby saving the production processes and improving the production efficiency. A material of each of the semi-finished product 26 of the second capacitor electrode and the semi-finished product 27 of the second active layer may be IGZO, IZTO, IGZTO, or the like.

Figure 9:
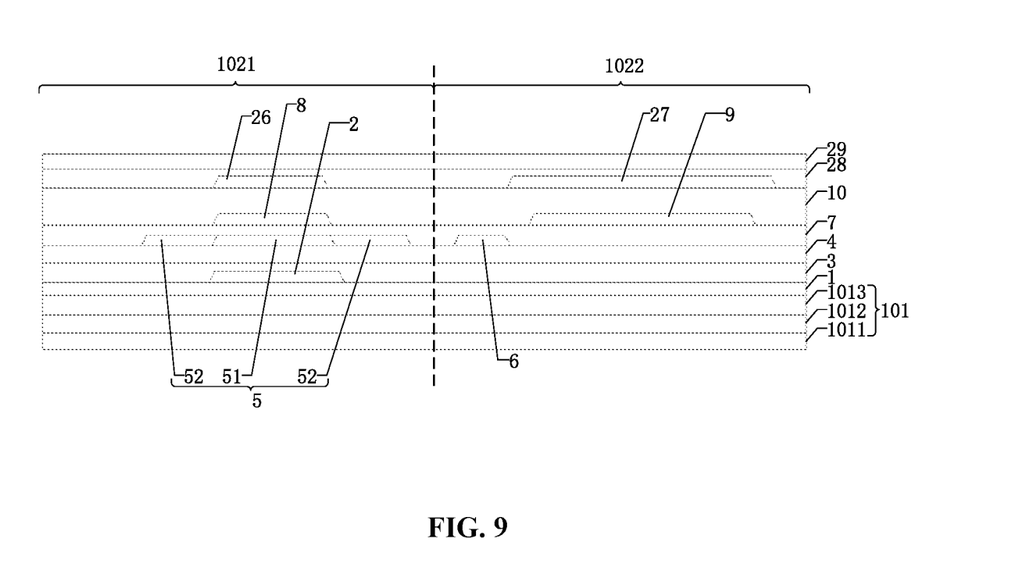
FIG. 9 is a schematic diagram of preparing a semi-finished product of a second insulating layer on a semi-finished product of a second capacitor electrode, a semi-finished product of a second active layer, and the first capacitor dielectric; and preparing a second metal thin film on the semi-finished product of a second insulating layer.

As shown in FIG. 9, the step of forming each of the pixel units 102 further includes: S10, forming a semi-finished product 28 of the second insulating layer on the semi-finished product 26 of the second capacitor electrode, the semi-finished product 27 of the second active layer, and the first capacitor dielectric 10.

Figure 10:
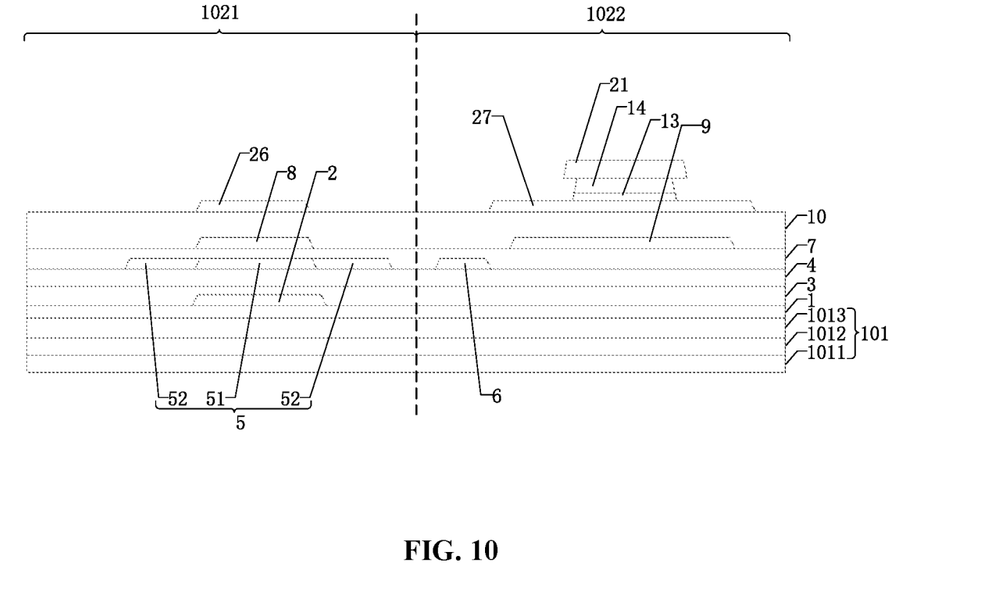
FIG. 10 is a schematic diagram after etching a semi-finished product of a second insulating layer and the second metal film by using a photoresist pattern.

As shown in FIG. 9 and FIG. 10, the step of forming each of the pixel units 102 further includes: S11, preparing a second gate electrode 14 on the semi-finished product 28 of the second insulating layer. The step S11 specifically includes: preparing a second metal film 29 on the semi-finished product 28 of the second insulating layer; then coating a layer of photoresist on an entire surface of the second metal film 29; then patterning the entire surface of the photoresist and remaining a part of the photoresist to form a photoresist pattern; then etching the second metal film 29 not covered by the photoresist pattern 21 to form the second gate 14; and then etching the semi-finished product 28 of the second insulating layer not covered by the photoresist pattern 21 to form the second insulating layer 13.

Figure 11:
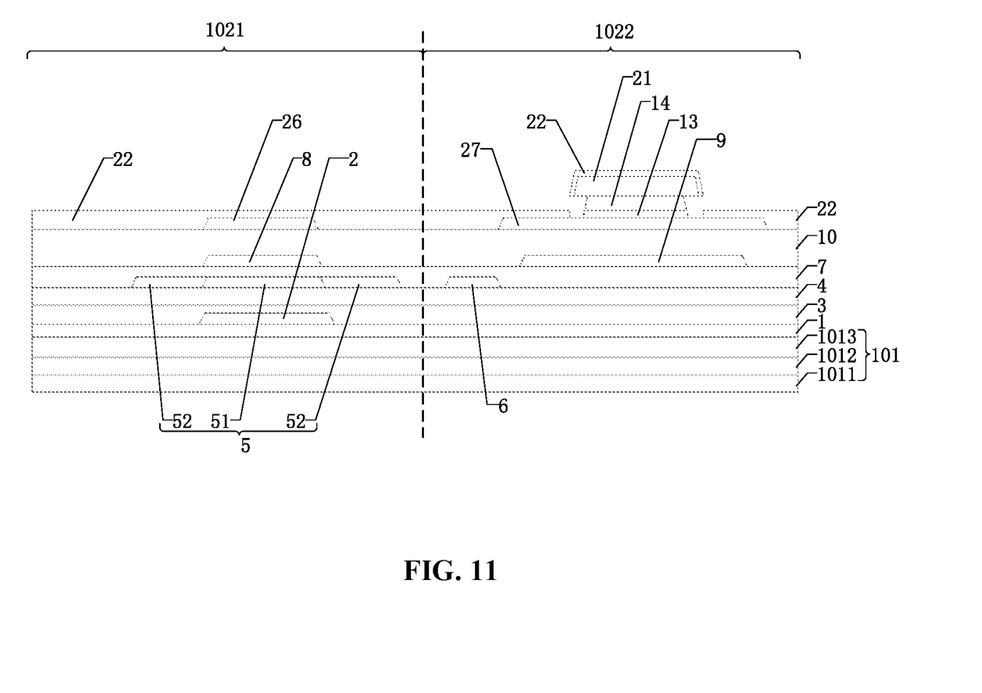
FIG. 11 is a schematic diagram of depositing an aluminum layer on a basis of FIG. 10.

As shown in FIG. 11, the step of forming each of the pixel units 102 further includes: S12, remaining the photoresist pattern 21, and preparing an aluminum layer 22 on the semi-finished product 26 of the second capacitor electrode, part of the semi-finished product 27 of the second active layer, and the photoresist pattern 21. The aluminum layer 22 partially covers the semi-finished product 27 of the second active layer, and a gap is defined between the aluminum layer 22 and the second gate insulating layer 13 and the second gate 14. A main purpose is to disconnect the aluminum layer on the photoresist pattern 21 from the aluminum layer 22 on the semi-finished product 27 of the second active layer, so as to ensure that the aluminum layer on the photoresist pattern 21 can be removed subsequently by stripping the photoresist pattern 21, and also to be used to prevent a contact between the aluminum layer 22 and the second gate 14 to result in short-circuit.

Figure 12:
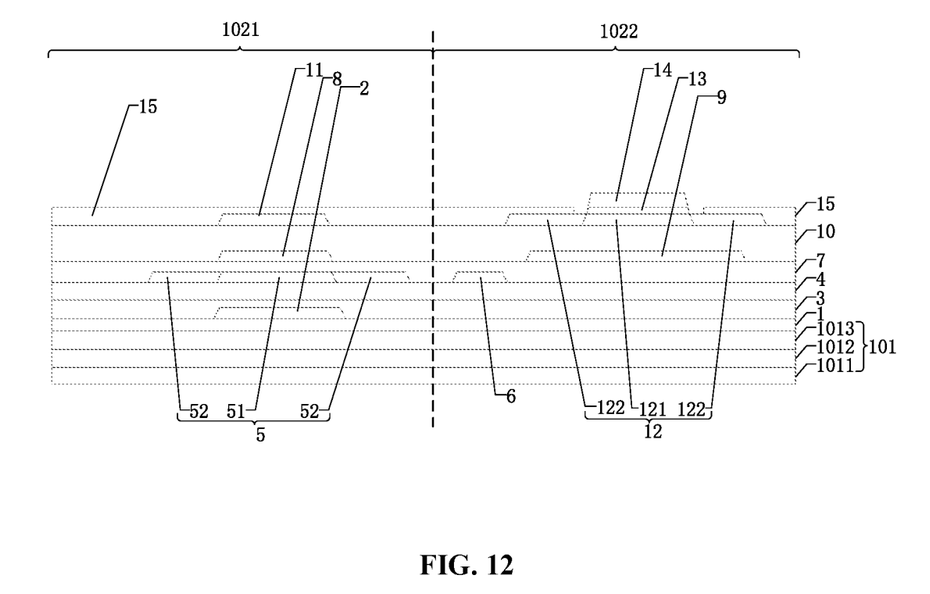
FIG. 12 is a schematic diagram of annealing an aluminum layer after stripping to remove the photoresist.

As shown in FIG. 12, the step of forming each of the pixel units 102 further include: S13, stripping to remove the photoresist pattern 21, and annealing the aluminum layer 22, so that the aluminum layer 22 and oxygen (O) in the material of the semi-finished product 26 of the second capacitor electrode covered by the aluminum layer 22 are combined to form $Al_2O_3$, that is, the second capacitor dielectric 15. Meanwhile, the semi-finished product of the second capacitor electrode is transformed into the second capacitor electrode 11; the aluminum layer 22 and oxygen (O) in the material of a part of the semi-finished product 27 of the second active layer covered by the aluminum layer 22 are combined to form $Al_2O_3$, that is, the second capacitor dielectric 15. Meanwhile, a part of the semi-finished product 27 of the second active layer covered by the aluminum layer 22 is conductorized into the second connection portion 122; and a remaining part of the semi-finished product 27 of the second active layer that is not conductorized maintain the semiconductor characteristics to form the second channel portion 121.

Figure 13:
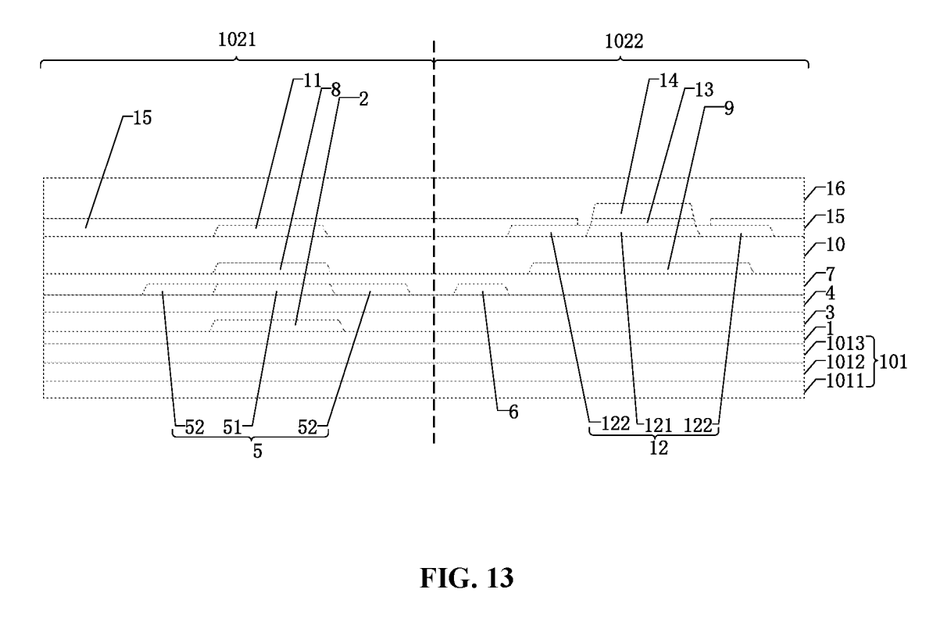
FIG. 13 is a schematic diagram of forming an interlayer insulating layer on a basis of FIG. 12.

As shown in FIG. 13, the step of forming each of the pixel units 102 further includes: S14, forming an interlayer insulating layer 16 at the gap between the second capacitor dielectric 15 and the second gate 14, and the gap between the second capacitor dielectric 15 and the second insulating layer 13.

Figure 14:
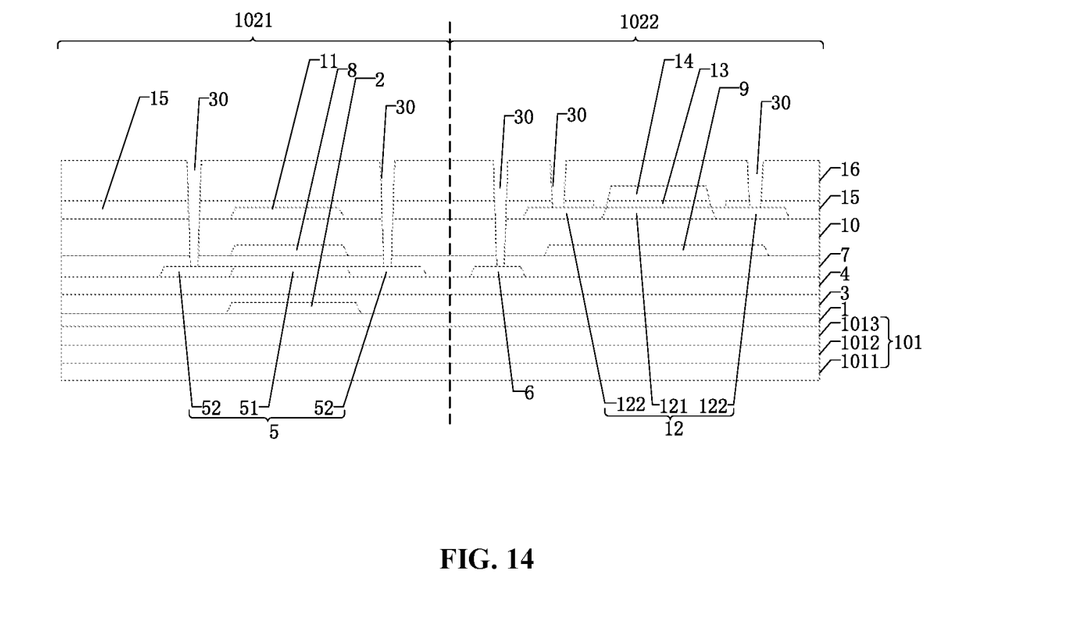
FIG. 14 is a schematic diagram of forming a connection hole on a basis of FIG. 13.

As shown in FIG. 14, the step of forming each of the pixel units 102 further includes: S15, etching the interlayer insulating layer 16, the second capacitor dielectric 15, the first capacitor dielectric 10, and the first insulating layer 7 to form a plurality of connection holes 30.

Figure 15:
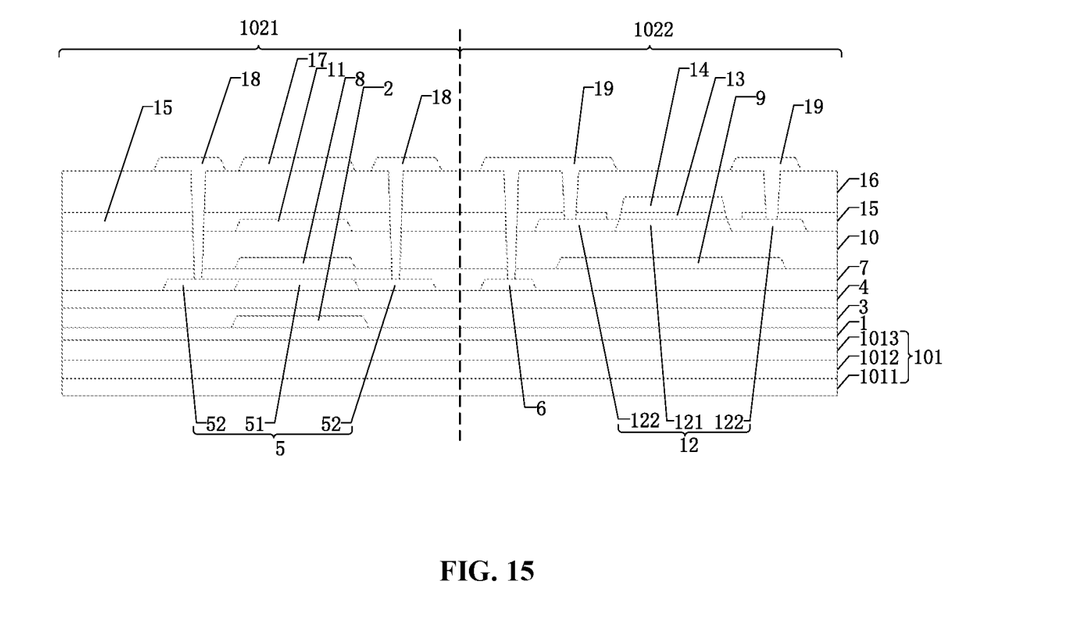
FIG. 15 is a schematic diagram of forming a first source-drain layer, a second source-drain layer, and a third capacitor electrode on a basis of FIG. 14.

As shown in FIG. 15, the step of forming each of the pixel units 102 further includes: S16, preparing a third capacitor electrode 17, a first source-drain layer 18, and a second source-drain layer 19 on the interlayer insulating layer 16 and in the connection holes 30. The first source-drain layer 18, the second source-drain layer 19, and the third capacitor electrode 17 are prepared and formed at the same time, thereby saving the production processes, and improving the production efficiency.

As shown in FIG. 1, the step of forming each of the pixel units 102 further includes: S17, forming a passivation layer 20 on the third capacitor electrode 17, the first source-drain layer 18, the second source-drain layer 19, and the interlayer insulating layer 16.

The display panel and the manufacturing method thereof provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising a substrate and a plurality of pixel units disposed on the substrate, and each of the pixel units comprises: a driving area and a switching area, wherein each of the pixel units comprises:
a storage capacitor disposed in the driving area, wherein the storage capacitor comprises:
a first capacitor electrode disposed on the substrate in the driving area;
a first capacitor dielectric disposed on a surface of a side of the first capacitor electrode away from the substrate, and extending to cover the substrate;
a second capacitor electrode disposed on a surface of a side of the first capacitor dielectric away from the substrate, and arranged corresponding to the first capacitor electrode;
a second capacitor dielectric is disposed on a surface of a side of the second capacitor electrode away from the substrate, and extending to cover the first capacitor dielectric;
an interlayer insulating layer disposed on a surface of a side of the second capacitor dielectric away from the substrate; and
a third capacitor electrode disposed on a surface of a side of the interlayer insulating layer away from the substrate, and arranged corresponding to the second capacitor electrode;
wherein each of the pixel units comprises:
a driving thin film transistor disposed in the driving area, wherein the driving thin film transistor comprises:
a first active layer disposed between the substrate and the first capacitor electrode;
a first insulating layer disposed between the first active layer and the first capacitor electrode, and extending to cover the substrate;
a first gate disposed in a same layer as the first capacitor electrode; and
a first source-drain layer disposed on the surface of the side of the interlayer insulating layer away from the substrate, and disposed in a same layer as the third capacitor electrode.

2. The display panel according to claim 1, wherein each of the pixel units comprises:
a switching thin film transistor disposed in the switching area, wherein the switching thin film transistor comprises:
a second active layer disposed between the first capacitor dielectric and the interlayer insulating layer, and disposed in a same layer as the second capacitor electrode;
a second insulating layer disposed between the second active layer and the interlayer insulating layer;
a second gate disposed between the second insulating layer and the interlayer insulating layer; and
a second source-drain layer disposed on the surface of the side of the interlayer insulating layer away from the substrate, and disposed in the same layer as the third capacitor electrode.

3. The display panel according to claim 2, wherein each of the pixel units further comprises:
a light-shielding unit disposed between the first insulating layer and the first capacitor dielectric, and arranged corresponding to the second active layer, and disposed in a same layer as the first capacitor electrode.

4. The display panel according to claim 2, wherein the second capacitor dielectric partially covers the second active layer; and
gaps are defined between opposite sides of the second insulating layer and the second capacitor dielectric.

5. The display panel according to claim 1, wherein the second capacitor dielectric is made of $Al_2O_3$.

6. The display panel according to claim 1, wherein a thickness of the second capacitor dielectric ranges from 50 angstroms to 100 angstroms.

7. A method of manufacturing a display panel, comprising the following steps:
providing a substrate, and forming a plurality of pixel units on the substrate, wherein each of the pixel units comprises: a driving area and a switching area;
wherein the step of forming each of the pixel units comprises:
forming a storage capacitor in the driving area, which comprises:
forming a first capacitor electrode on the substrate in the driving area;
forming a first capacitor dielectric on a surface of a side of the first capacitor electrode away from the substrate, wherein the first capacitor dielectric extends to cover the substrate;
forming a second capacitor electrode on a surface of a side of the first capacitor dielectric away from the substrate, wherein the second capacitor electrode is arranged corresponding to the first capacitor electrode;
forming a second capacitor dielectric on a surface of a side of the second capacitor electrode away from the substrate, wherein the second capacitor dielectric extends to cover the first capacitor dielectric;
forming an interlayer insulating layer on a surface of a side of the second capacitor dielectric away from the substrate; and
forming a third capacitor electrode on a surface of a side of the interlayer insulating layer away from the substrate, wherein the third capacitor electrode is arranged corresponding to the second capacitor electrode;
wherein before the step of forming the second capacitor dielectric on the surface of the side of the second capacitor electrode away from the substrate, the manufacturing method further comprises the following steps:
forming a second active layer on the surface of the side of the first capacitor dielectric away from the substrate; wherein the second active layer and the second capacitor electrode are formed at a same time;
forming a second insulating layer on a surface of a side of the second active layer away from the substrate; and forming a second gate on a surface of a side of the second insulating layer away from the substrate.

8. The method of manufacturing a display panel according to claim 7, wherein before the step of forming the first capacitor dielectric on the surface of the side of the first capacitor electrode away from the substrate, the manufacturing method further comprises the following steps:
  forming a light-shielding unit on the substrate in the switching area,
  wherein the light-shielding unit and the first capacitor electrode are formed at a same time.

* * * * *